United States Patent
Huang et al.

(10) Patent No.: US 7,268,070 B2
(45) Date of Patent: Sep. 11, 2007

(54) PROFILE IMPROVEMENT METHOD FOR PATTERNING

(75) Inventors: Hui-Ling Huang, Tai-Chung (TW); Benjamin Szu-Min Lin, Hsin-Chu (TW); Cheng-Chung Chen, Tao-Yuan (TW); George Liu, Tao-Yuan (TW)

(73) Assignee: United Microelectronics Corp., Hsin-Chu (TW)

( * ) Notice: Subject to any disclaimer, the term of this patent is extended or adjusted under 35 U.S.C. 154(b) by 238 days.

(21) Appl. No.: 10/445,047

(22) Filed: May 27, 2003

(65) Prior Publication Data

US 2004/0241587 A1 Dec. 2, 2004

(51) Int. Cl.
*H01L 21/47* (2006.01)
*H01L 21/4757* (2006.01)

(52) U.S. Cl. .................. 438/637; 430/313; 430/330

(58) Field of Classification Search .......... 438/585, 438/637, 638, 669, 671; 430/311, 315, 313, 430/330
See application file for complete search history.

(56) References Cited

U.S. PATENT DOCUMENTS

| | | | | |
|---|---|---|---|---|
| 6,100,014 A * | 8/2000 | Lin et al. | ................. | 430/314 |
| 6,107,177 A * | 8/2000 | Lu et al. | ................. | 438/597 |
| 6,207,328 B1 * | 3/2001 | Lin | ................. | 430/5 |
| 6,399,481 B1 * | 6/2002 | Yamada | ................. | 438/636 |
| 6,485,895 B1 * | 11/2002 | Choi et al. | ................. | 430/330 |
| 6,489,085 B2 * | 12/2002 | Huang et al. | ................. | 430/322 |
| 6,582,891 B1 * | 6/2003 | Hallock et al. | ................. | 430/330 |
| 6,602,794 B1 * | 8/2003 | Kye | ................. | 438/725 |
| 6,740,473 B1 * | 5/2004 | Lin et al. | ................. | 430/315 |
| 6,753,117 B2 * | 6/2004 | Lu | ................. | 430/30 |
| 6,803,176 B2 * | 10/2004 | Choi et al. | ................. | 430/330 |
| 6,806,038 B2 * | 10/2004 | Gu et al. | ................. | 430/318 |
| 6,872,513 B2 * | 3/2005 | Meagley | ................. | 430/324 |
| 6,893,972 B2 * | 5/2005 | Rottstegge et al. | ................. | 438/706 |
| 6,916,594 B2 * | 7/2005 | Bok et al. | ................. | 430/270.1 |
| 7,090,967 B2 * | 8/2006 | Lu et al. | ................. | 430/324 |

OTHER PUBLICATIONS

Ishibashi et al., Advanced Micro-Lithography Process with Chemical Shrink Technology, Jpn. J. Appl. Phys., vol. 40 (2001), pp. 419-425.*

* cited by examiner

*Primary Examiner*—M. Wilczewski
(74) *Attorney, Agent, or Firm*—Harold L. Novick; Matthew J. Moffa; The Nath Law Group

(57) ABSTRACT

There is a grain phenomenon issue of rough sidewall for patterning. Thus, imprecise grain profiles would be observed. As the critical dimensions of integrated circuit microelectronics fabrication device have decreased, the effect of grain phenomenon have become more pronounced. A profile improvement method with a thermal-compressive material and a thermal-compressive process is provided to solve the grain phenomenon issue for baseline of 0.09 um generation and beyond. With this material, the profile can be improved no matter in top view or lateral view. Furthermore, there are 0.1 um IDOF improvement and better physical etching performance.

13 Claims, 4 Drawing Sheets

PROFILE IMPROVEMENT METHOD FOR PATTERNING

BACKGROUND OF THE INVENTION

1. Field of the Invention

The present invention relates to a thermal-compressive material and a thermal-compressive process, whereby the grain phenomenon issue is resolved. More particularly, the present invention relates to a thermal-compressive material and a thermal-compressive process for baseline of 0.09 um generation and beyond.

2. Description of the Prior Art

A typical photolithography process used in the fabrication of a semiconductor as follows. A material layer to be patterned is formed on a substrate. The material layer is made of polycide, polysilicon, silicon oxide, metal, nitride or the like. Then, a photoresist layer is deposited on the material layer to be patterned. Thereafter, the photoresist layer is exposed in selected regions with the light through a mask. The photoresist layer is then removed in the regions other than the selected regions. Then, a process can be performed in the underlying layer through the removed portions of the photoresist layer, such as removing the portions of the underlying layer to be patterned. As the variety of the suitable photoresist material changes, so does the variety of the wavelength of applied light.

There are three kinds of typical polymers for 193 nm resist. One is Acryle type that is famous for its etching resistance but it is bad for the photo performance. Another is Methacryle type. The advantage is the photo performance but not for the etching resistance. In order to compromise between the photo and the etching performance, the hybrid type is mixed by Acryle and Methacryle which has been introduced. However, the profile has a grain phenomenon issue. That is, the sidewall has a rough surface.

In the fabrication of semiconductor wafers, the photolithography steps are critical when patterning the minimum feature width, dictated by given photolithography equipment, onto a wafer. Several factors come into play that will affect the dimension and profile of a structure that has resulted from the photolithography steps performed.

One factor is the quality of the mask material (photoresist layer) itself. Another factor is the effectiveness of the light source (usually ultraviolet light) to expose the photoresist layer in direct correlation to an overlying mask or reticle. Though, the quality of photoresist layer must continually be monitored and improved, the exposure of the photoresist layer to a light source to provide the desired patterned, is an area where the major engineering efforts are ongoing.

The effectiveness of proper light exposure of the photoresist layer, not only depends on the photoresist material itself, but also on other factors such as the type of underlying film that is being patterned. Maintaining a desired profile becomes even more difficult when patterning a material that has a rough surface, such as a refractory metal that is made rough by the shape of its grains. For examples, when patterning a refractory metal, the unevenness of the grains results in the film possessing non-uniform adsorption and reflective properties to light. During a photo step, these non-uniform properties of the light which results from the light reflecting back into the photoresist layer at varying angles to cause reflective notching of the photoresist layer. Though reflective notching can be caused by any underlying film that is being patterned, it is a major problem when patterning the rough surfaced refractory metal.

Another challenge that is presented by the uneven grain of a refractory metal presents, comes to play during the etching step. Usually it is desired to obtain the most vertical profile as possible. However, the uneven grains of the refractory metal silicide, cause the vertical profile to become jagged and less vertical, both undesirable results.

Another factor of possessing non-uniform adsorption and reflective properties for the light is standing waves. Standing waves happen when the actinic light waves propagate through a resist film down to the substrate, where they are reflected back up through the resist. The reflected waves constructively and destructively interfere with the incident waves and create zones of high and low exposure with a separation of $(\lambda\backslash 4n)$, where n is the index of refraction of the photoresist layer. It causes unwanted effects in resist layers in two ways. First, the periodic variation of light intensity in the resist layer causes the resist layer to receive non-uniform doses of energy throughout the layer thickness. The second effect is due to the variation of the total energy coupled to the resist layer by interference effects at different resist thickness. Both effects contribute to resolution loss of resist layer, and become significant as 1 μm resolutions are approached.

Referring to FIG. 1A and FIG. 1B, the phenomenon is shown in lateral view and top view. Shown in FIG. 1A is a material layer 12 to be patterned formed on a substrate 10. The material layer 12 to be patterned is made of polysilicon, polycide, silicon oxide, nitride or metal. A photoresist layer 14 is deposited on the material layer 12 to be patterned. Thereafter, the photoresist layer 14 is exposed in selected regions with the light 18 through a mask 16. In developing process, the photoresist layer 14 is then removed in the regions exposed. Shown in FIG. 1B is the result of developing the photoexposed photoresist layer 14 which is illustrated in FIG. 1A, wherein photoexposed patterned photoresist layers 14a and 14b formed upon the materials layer 12. Due to the standing wave and polymer grains, the photoexposed patterned photoresist layers 14a and 14b have irregularly formed rough sidewalls. The roughness forms numerous prominence 141 and indentations 142 on the surface of sidewalls. Shown in FIG. 1C is a CD-SEM of the noncircular profile for hole patterning appeared in positive defocus in top view although has in-spec CD. This is the aforementioned grain phenomenon issue.

Highly reflective substrates accentuate the standing wave effects, and thus attempts to suppress such effects have involved the use of dyes and anti-reflective coating below the resist layer. Other approaches have also been investigated, include: the use of incident UV radiation of multiple wavelengths, to reduce the variation of energy coupling by averaging; and post-baking between exposure and development. Although those approaches can resolve some problems, it is hard to completely eliminate the problem of grain phenomenon issue and needs many expensive cost and processes to archive them.

To be within acceptable manufacturing quality, critical dimensions (the widths of lines and spaces of critical circuit patterns) have to be within a predetermined acceptable margin for error tolerance. The size of the sidewall grains is probably larger than 10 nm or more and it is of little significance when critical dimensions are large in early processes. However, it is more and more critical for baseline of 90 nm generation and beyond. With grain phenomenon issue, critical dimensions are not uniform. For example, referring to FIG. 1C the hole pattern on photoresist is noncircular. For better manufacturing quality, the demand DOF (depth of focus) is limited. If the pattern transforming is more precise, the DOF and manufacturing quality can be improved both. What is needed is a solution to make the sidewall smooth, so that the profile is improved and more precise.

SUMMARY OF THE INVENTION

It is one objective of the present invention to provide a profile improvement method for patterning by using a thermal-compressive material to make the grain and noncircular profiles not to be observed after applying this process. Namely, smooth sidewalls will be observed. By way of this, the influences of standing waves and grain phenomenon effectively eliminated.

It is another objective of the present invention to provide a thermal-compressive process with applying a thermal-compressive material, wherein there is physical reaction only and the thermal-compressive material is removed easily. By way of this, better physical etching performance is gained.

In accord with the objects of the present invention, there is provided by the present invention a profile improvement method for patterning with a thermal-compressive material and a thermal-compressive process. To practice the method of the present invention, there is a substrate first provided to employ within a microelectronics fabrication. There is a material layer formed to be patterned and a photoresist layer thereon. After developing, a patterned photoresist layer with sidewall grains is formed. There is subsequently a thermal-compressive material formed to coat upon the photoresist layer. The thermal-compressive material has a shrinkage characteristic during heat treatment. In contrary, the photoresist layer expends during heat treatment. By heating up to appropriate temperature, there is a force to pull the sidewall out to be smooth, hereof the process needs to be controlled not to heat too excessively to change the line width. Finally, the thermal-compress material is removed.

The present invention provides a profile improvement method for patterning, wherein a thermal-compressive process is applied. By different expansion coefficients between photoresist and thermal-compressive material, effectively smooth resist grain and noncircular profiles are formed in physical reaction only.

The present invention may be employed where the microelectronics fabrication is an integrated circuit microelectronics fabrication. Although the method of the present invention is more likely to provide value for forming effectively smooth resist grain and noncircular profile of sidewalls within photoresist layer, the method of the present invention may be employed within layers, being not limited to photoresist layer for baseline of 0.09 um generation and beyond, with rough sidewalls.

To achieve these objects and in accordance with the purpose of the invention, the invention using thermal-compressive material comprises the following features: effectively smooth resist grain and noncircular profiles, applying a thermal-compressive material that is developer solvable or water solvable and easy to be removed, low processing temperature, and physical reaction only (different expansion coefficients between photoresist and thermal-compressive material).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
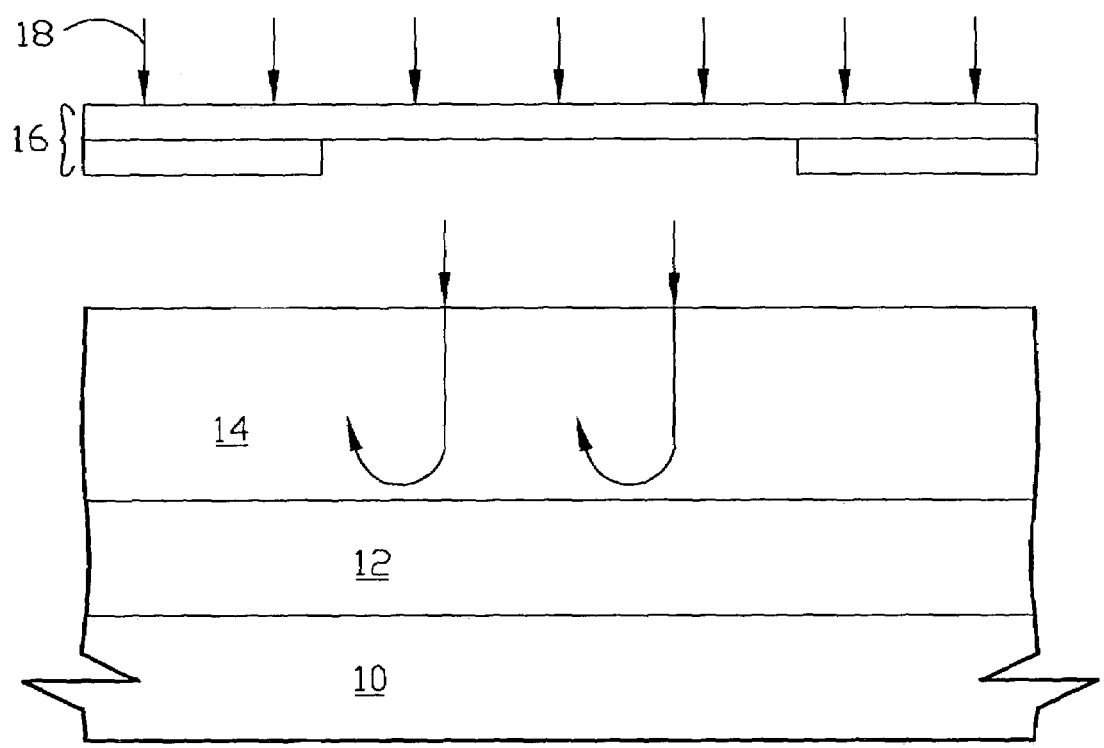
FIG. 1A and FIG. 1B are schematic cross sectional diagrams illustrating the formation of photoexposed patterned photoresist layers with rough sidewall.
Figure 1B:
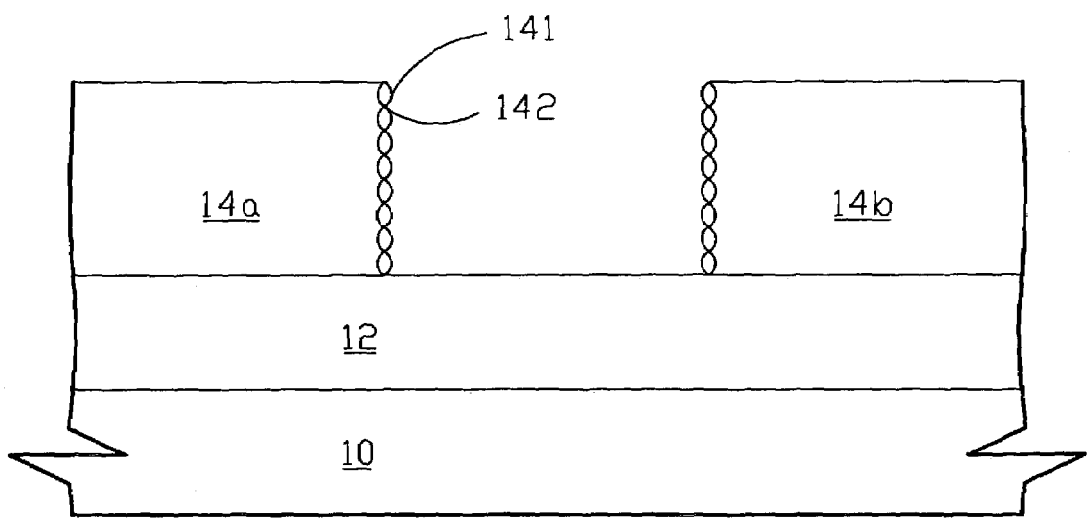
Figure 1C:
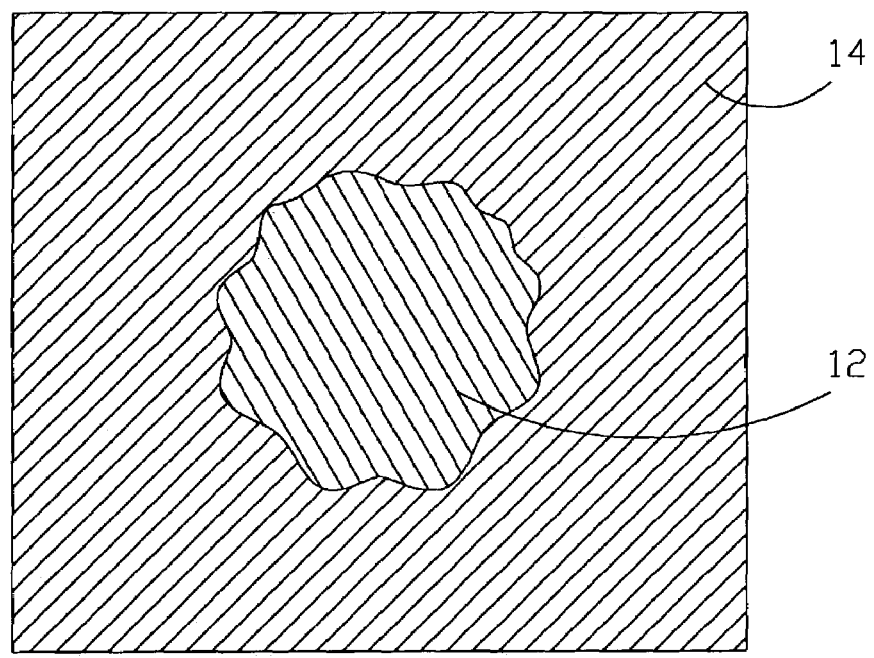
FIG. 1C is a profile in top view with noncircular patterning of photoexposed patterned photoresist layers with rough sidewalls.

The present invention uses an easily removable thermal-compressive material and a thermal-compressive process to form effectively smoothing resist grain and noncircular profiles for patterning. That is, the grain and noncircular profiles shown in FIG. 1A and FIG. 1B in lateral view and top view separately would not be observed. Meanwhile, there is physical reaction only between photoresist and the thermal-compressive material without any chemical changing for photoresist layer and the material layer to be patterned. Furthermore, the present invention will have 0.1 um IDOF improvement and better physical etching performance.

Figure 2A:
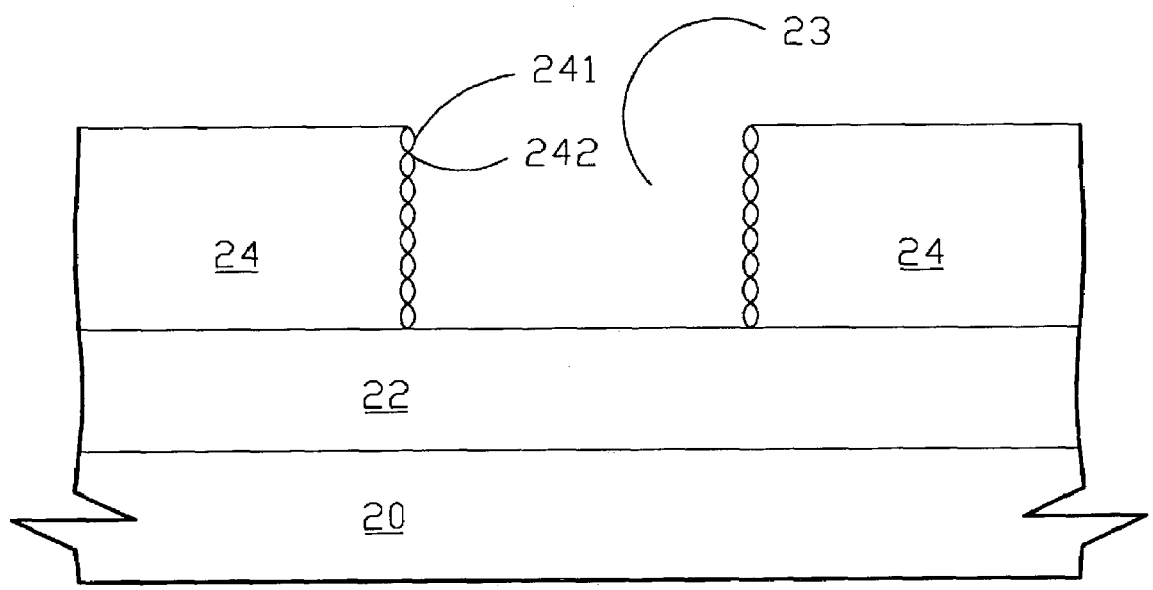
FIG. 2A is a profile diagram in lateral view before profile improvement of one preferred embodiment of the present invention.

Referring to FIG. 2A, a material layer 22 is formed on a substrate 20, and a pattern 23 is formed into a photoresist (PR) layer 24 that is formed upon the material layer 22. The material layer 22 comprises a dielectric layer and a conductive layer such as polysilicon, polycide, silicon oxide, nitride or metal. The pattern 23 is formed into the PR layer 24 by a photolithography process to expose the material layer 22. The pattern 23 comprises a contact hole, a trench, a via plug, a gate electrode and a lead line. Due to the phenomenon of standing waves and polymer grains of the PR layer 24, the photolithography process has a sidewall with a rough surface. The rough surface has numerous prominence 241 and indentations 242.

Figure 2B:
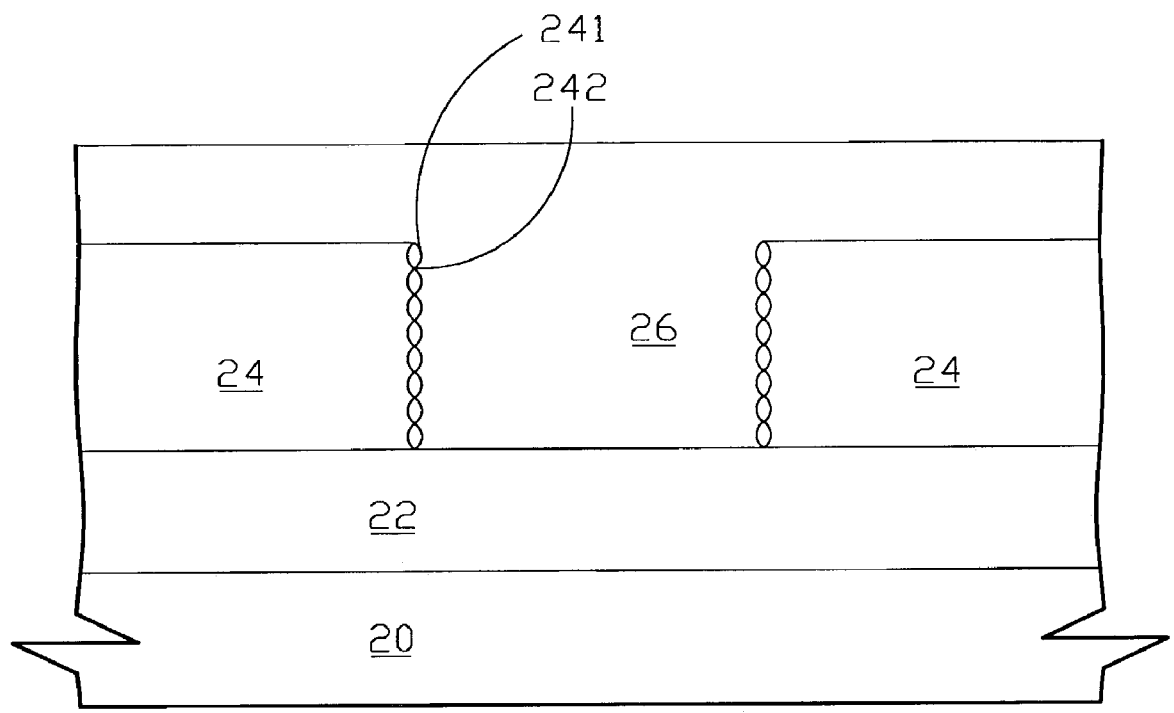
FIG. 2B is a profile diagram in lateral view with coating of a thermal-compressive material of one preferred embodiment of the present invention.

Referring to FIG. 2B, a thermal-compressive material layer 26 is formed over the PR layer 24 and into the pattern 23. The thermal-compressive material layer 26 fills to the full indentations and coats the whole photoresist layer, wherein the indentations is the exposed regions in positive photoresist or the unexposed regions in negative photoresist. They can be trenches, interconnects and the like. The expansion coefficients of the photoresist and the thermal-compressive material are different. The thermal-compressive material layer 26 can be removed easily by using water or developer.

Figure 2C:
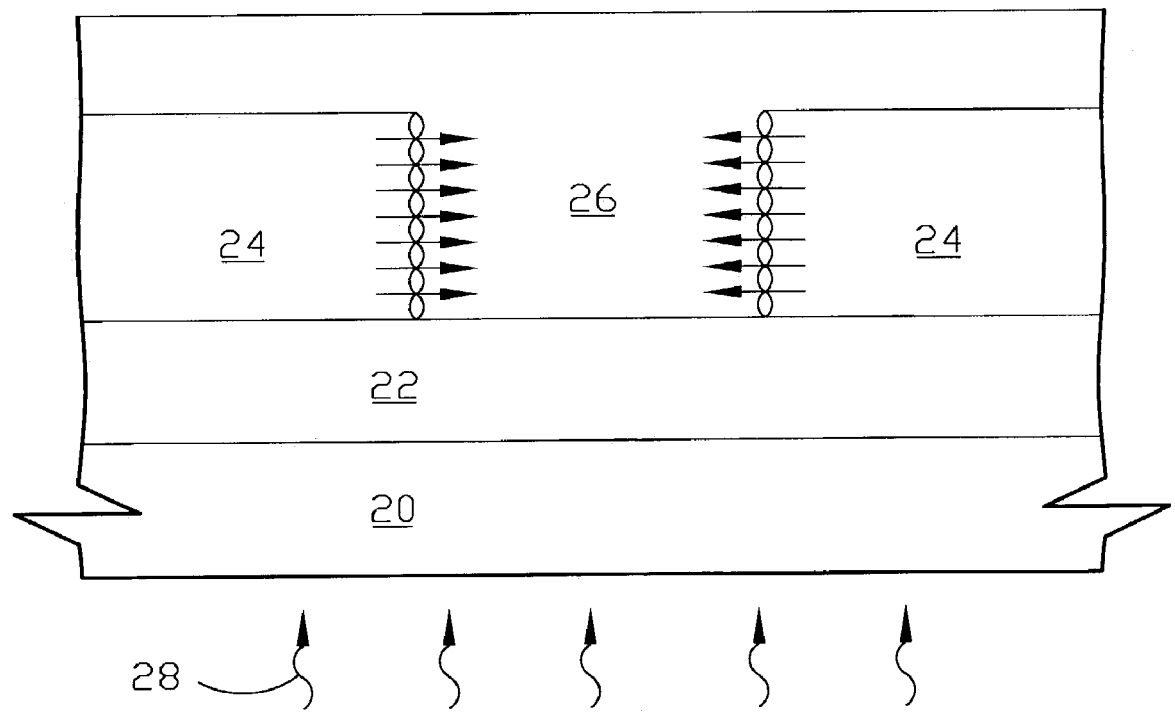
FIG. 2C is a profile diagram in lateral view with thermal treatment of one preferred embodiment of the present invention.

Referring to FIG. 2C, a thermal-compressive treatment is performed by heating the substrate 20, on a hot plate to render the thermal-compressive material layer 26 shrinking. Since the photoresist layer 24 tends to expend and the thermal-compressive material layer 26 that will compress and shrink when the substrate 20 is heated, the sidewall of the pattern 23 is subjected to a force to pull it out toward the thermal-compressive material layer 26. With surface tension and the pulling force, the sidewall will become more and more smooth during the thermal treatment. If the temperature is too high, the line width may be changed excessively, and the overhigh temperature could induce the pattern shape variation. Thus, the temperature has to be controlled to avoid line width being changed. To get better profile quality, for instance, the substrate is preferably heated at a temperature between about 130° C. to 160° C. and the duration preferably lasting about 30 to 90 seconds.

The thermal-compressive material can be water solvable or developer solvable and removed by using water or developer. It is preferably to remove the thermal-compressive material by a developing process with developer.

Figure 2D:
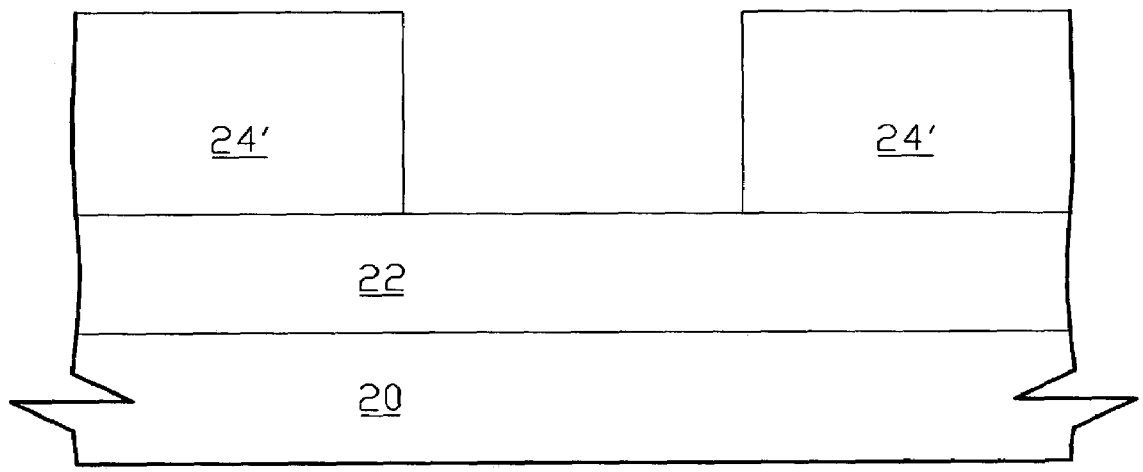
FIG. 2D is a diagram in lateral view after profile improvement of one preferred embodiment of the present invention.
Figure 2E:
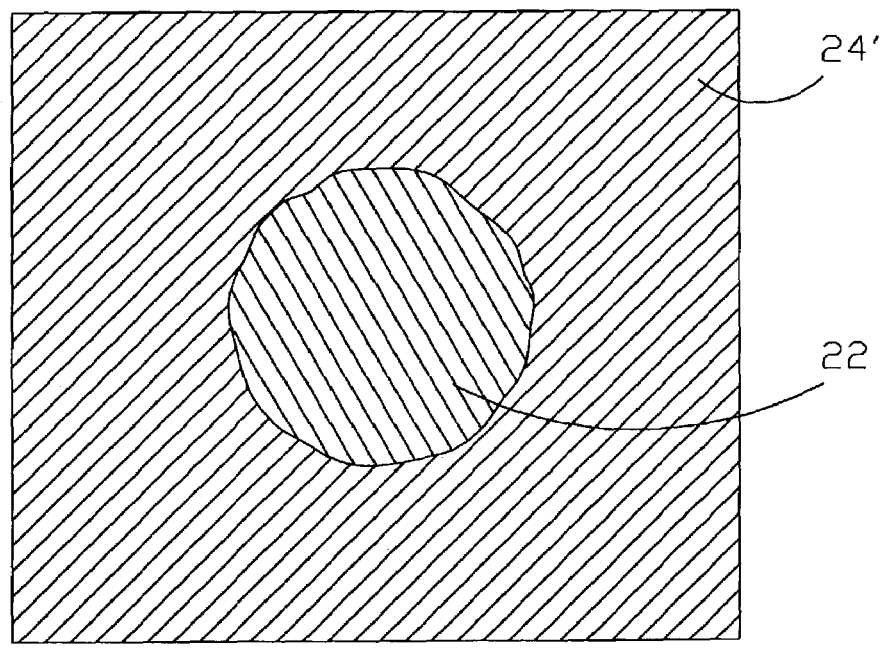
FIG. 2E is a profile in top view with approximate circular patterning of one preferred embodiment of the present invention.

The embodiment of the present invention provides a thermal-compressive process, it comprises the following steps: coating a thermal-compressive material, heating the substrate and removing the thermal-compressive material. After the thermal-compressive layer is removed, the pattern 23 can be filled with a conductive layer or the material layer 22 can be etched. Referring to FIG. 2D, a smooth sidewall of the patterned photoresist layer 24' is formed after applying the thermal-compressive process. Eliminating the roughness of the sidewall, the reserved margin for tolerating fault can be narrowed. Namely, the applying range of depth of focus can be widened and the inaccuracy tolerance can be increased. Besides, the pattern 23 transfer is more precise as what it should be. Referring to FIG. 2E, a top view of the pattern 23 in FIG. 2D is shown, a smooth profile in top view can be observed. The more precise the pattern 23 is formed on the resist layer, the better physical etching performance is gained.

In the embodiment of the present invention, a thermal-compressive material and a thermal-compressive process are used to solve the grain phenomenon issue especially for pattern baseline of 0.09 um generation and beyond. The grain and rough profile would be not observed after applying the thermal-compressive process. The profile improvement method for patterning using thermal-compressive material has the following advantages: effectively smoothing PR grain and rough profiles, better physical etching performance, low temperature range (130° C. to 160° C.) and easy removal of thermal-compressive material by developer or water.

The preferred embodiment is only used to illustrate the present invention; it is not intended to limit the scope thereof. Many modifications of the embodiments can be made without departing from the spirit of the present invention.

What is claimed is:

1. A profile improvement method for smoothing a sidewall of an aperture, said method comprising the steps of:
   providing a material layer;
   forming a photoresist layer on said material layer;
   patterning said photoresist layer to form said aperture;
   forming a thermo-compressive layer over said aperture and said photoresist layer;
   heating said thermo-compressive layer and said photoresist layer to simultaneously cause said photoresist layer expanding and said thermo-compressive layer compressing, thus smoothing the sidewall in a physical manner; and
   removing said thermo-compressive layer.

2. The method according to claim 1, wherein said material layer comprises a dielectric layer.

3. The method according to claim 1, wherein said material layer comprises a conductive layer.

4. The method according to claim 1, wherein said aperture comprises a contact hole pattern.

5. The method according to claim 1, wherein said aperture comprises a trench pattern.

6. The method according to claim 1, wherein said aperture comprises a via plug pattern.

7. The method according to claim 1, wherein said aperture comprises a gate electrode pattern.

8. The method according to claim 1, wherein said aperture comprises a lead line pattern.

9. The method according to claim 1, wherein said thermal-compressive layer and said photoresist layer are heated at a temperature between about 130° C. to 160° C. for about 30 to 90 seconds.

10. The method according to claim 1, further comprising:
    etching said material layer by using said photoresist layer as mask, after removing said thermal-compressive layer.

11. The method according to claim 10, wherein said thermal-compressive layer is removed by water.

12. The method according to claim 10, wherein said thermal-compressive layer is removed by a developer.

13. The method according to claim 1, further comprising:
    filling said aperture with a conductive layer, after removing said thermal-compressive layer.

* * * * *